United States Patent
Pau et al.

[19]

[11] Patent Number: 5,877,509
[45] Date of Patent: Mar. 2, 1999

[54] QUANTUM WELL EXCITON-POLARITON LIGHT EMITTING DIODE

[75] Inventors: Stanley Pau, Stuttgart, Germany; Hui Cao; Yoshihisa Yamamoto, both of Stanford, Calif.

[73] Assignees: Stanford University, Stanford, Calif.; Japan Science and Technology Corporation, Saitama, Japan

[21] Appl. No.: 970,948

[22] Filed: Nov. 14, 1997

[51] Int. Cl.$^6$ ..................................................... H01L 29/06
[52] U.S. Cl. ................................. 257/14; 257/25; 257/96; 257/98; 372/45
[58] Field of Search ................................. 257/14, 25, 94, 257/96, 98; 372/45

[56] References Cited

U.S. PATENT DOCUMENTS

| | | | |
|---|---|---|---|
| 5,023,879 | 6/1991 | Wang et al. | 372/43 |
| 5,588,015 | 12/1996 | Yang | 372/45 |
| 5,610,413 | 3/1997 | Fan et al. | 257/97 |

*Primary Examiner*—Minh Loan Tran
*Attorney, Agent, or Firm*—Lumen Intellectual Property Services

[57] ABSTRACT

A light emitting device made of semiconducting materials. The device has an optical microcavity which supports a resonant mode of predetermined photon energy. Within the cavity is a quantum well of predetermined thickness and energy depth. The quantum well is designed such that it forms bound electron, exciton, lower polariton, and hole energy states of predetermined energy. The energy of an exciton state is set to equal the predetermined photon energy of the microcavity mode such that polariton states are created. A means is provided for resonantly tunneling electrons into a quantum well energy state. In a first embodiment, electrons resonantly tunnel into an electron energy state. In a second embodiment, electrons resonantly tunnel into an exciton energy state, during which tunneling the electrons simultaneously fuse with holes to form excitons. In the first embodiment, the electron state to lower polariton state transition energy is made equal to the energy of a longitudinal optical (LO) phonon of the quantum well material. This energy equivalence facilitates the rapid thermalization of resonantly tunneled electrons to combine with holes and form polaritons resonant with the cavity mode. Thermalization is rapid because it only requires the scattering of a single LO phonon. The photon component of the polariton is then emitted through the leaky cavity reflector. The second embodiment sets the exciton to polariton transition energy equal to the LO phonon energy to facilitate rapid thermalization to the polariton state. Photons are then emitted through the leaky Bragg reflector in the same manner as the first embodiment.

18 Claims, 8 Drawing Sheets

QUANTUM WELL EXCITON-POLARITON LIGHT EMITTING DIODE

FIELD OF THE INVENTION

This invention relates generally to light sources. More specifically, it relates to semiconductor light sources using quantum well structures.

BACKGROUND OF THE INVENTION

The development of high-speed, high-efficiency light sources is important in many applications. Optical data transmission, for example, can benefit from light emitting devices with increased speed and high quantum efficiency.

Quantum efficiency is defined as the ratio of the number of photons emitted in a desired direction to the number of charge carriers injected.

The performance of any light emitting device is judged by the speed and efficiency of the device. While the efficiency can be improved by better device design and/or better material growth processes, the speed is often limited by fundamental material properties. The speed of a device made of a given material is limited by the radiative lifetime of the charge carriers (electrons and holes), i.e., how fast the electrons and holes can recombine (across the band gap) to form a photon. The GaAs-AlGaAs system, for example, has a radiative lifetime of approximately 1 nanosecond.

In most light emitting devices, the electrons and holes must 'thermalize' before they can radiatively recombine, i.e., emit light. Thermalization is the process of charge carriers losing excess momentum and energy in the form of heat (phonons) to the surrounding crystal lattice. Excess energy or momentum in the charge carriers can prevent radiative recombination. Conventional thermalization allows charge carriers to lose an arbitrary amount of energy through the scattering of multiple acoustic phonons of arbitrary energy. This process is generally slow and is often a greater speed limitation than the radiative lifetime.

Solid state lasers have been used extensively as light sources, particularly where high speed is required. Such lasers have the disadvantage of having an emission threshold. The emission threshold is the result of the necessity of having a population inversion in the lasing medium. An emission threshold results in energy loss and nonlinear behavior which can complicate device operation. Therefore, it would be advantageous to have a light source with the speed of a solid state laser without the emission threshold.

In recent years, researchers have been investigating the use of quantum well (QW) semiconductor structures in optoelectronic devices such as light emitting devices.

QW structures are small regions in a semiconductor crystal with a different composition than the surrounding crystal. Quantum wells are planar. The QW has a different band-gap structure than the surrounding material and so can confine electrons or other particles (e.g., holes) within it. When confined to such a small region of space, particles can exhibit strongly wavelike properties. Most significantly, a confined electron can only have certain, discrete energies. These energies are determined by the physical dimensions of the QW and the intrinsic properties of the QW material and the surrounding material. Other particles or combinations of particles such as holes or excitons (bound electron-hole pairs) can be similarly affected by a QW. Proper selection of the QW geometry and material composition (of both QW and surrounding material) allows one to build QW structures with predetermined energy states for electrons, excitons, holes, and other particles.

Electrons and holes can be manipulated to travel between these energy states and therefore emit and detect photons of certain, predetermined energies.

U.S. Pat. No. 5,588,015 to Yang discloses light emitting devices based on electronic transitions between electron energy states in two closely spaced quantum wells (QWs). Electrons traveling from a first QW emit light as they step down to the lower energy state of the second QW. This invention requires two closely spaced QWs to operate. Also, the QWs must be made of dissimilar materials such that the conduction band edge of the first QW is lower in energy than the valence band edge of the second QW. Electrons are injected to the first QW using the well known technique of resonant tunneling.

U.S. Pat. No. 5,610,413 to Fan et al discloses a light emitting device exploiting electronic transitions in at least one QW and preferably multiple quantum wells separated by multiple barrier layers. The device of Fan requires that the energy of QW-bound excitons exceeds the energy of longitudinal optical phonons. This condition enables the excitons to exist at room temperature and also enables higher photon production (light output). It is notable that this invention does not tune the confined electronic energy states to match the energy of longitudinal optical phonons. Also, it is notable that this invention does not use a micro-optical cavity. The thermalization process exploited in this invention is relatively slow, and therefore slows the light emission of the device.

U.S. Pat. No. 5,023,879 to Wang et al discloses an optically pumped QW IR light source. This invention uses an asymmetric stepped QW to provide at least three electron energy states. The energy state transition energies are selected such that certain nonradiative recombinations are fast (via optical phonon scattering) and certain nonradiative recombinations are slow (via acoustic phonon scattering). Specifically, faster transition rates are facilitated by transition energies larger than the optical phonon energy of the QW material. Transitions with energies lower than the optical phonon energy have slower recombination rates due to their dependence upon acoustic phonon scattering. This difference in recombination rates facilitates the production of a population inversion in the QW, which allows for lasing. This device is necessarily optically pumped, which greatly increases the complexity and expense of an operating device.

None of these prior art devices provide a QW light emitting device with the speed and quantum efficiency that is possible with QW structures.

OBJECTS AND ADVANTAGES OF THE INVENTION

Accordingly, it is a primary object of the present invention to provide a QW light emitting device that:
1) has increased speed,
2) emits light of a narrow bandwidth,
3) emits substantially collimated light in a well-defined direction,
4) has improved quantum efficiency, and
5) does not have an emission threshold.

SUMMARY OF THE INVENTION

These objects and advantages are attained by a quantum well (QW) with predetermined electron, hole, and exciton energy states disposed inside an optical microcavity.

In a first embodiment, the QW has a bound electron state, a bound hole state, and a bound lower polariton state. These three states satisfy the following condition:

[electron state energy]+[hole state energy]−[lower polariton state energy]=longitudinal optical phonon energy.

Longitudinal optical (LO) phonons have specific energies which are different for different materials. In other words, every material which can support LO phonon oscillations has a characteristic LO phonon energy. The polariton state is formed from the bound exciton state by designing the microcavity and QW such that the photon energy of a microcavity mode is equal to the recombination energy of an exciton in the bound exciton state.

A means is provided for resonantly tunneling electrons into the bound electron energy state. This can be provided by a n-doped region separated from the QW by a thin barrier layer. The other side of the QW has a p-doped region which allows holes to spontaneously diffuse into the QW. Thus, the device preferably has a band gap structure similar to a resonant tunneling diode.

The operation of the device begins with applying a voltage across the p-doped and n-doped regions to induce resonant tunneling of electrons into the bound electron state. Electrons tunnel from the n-doped region, through the thin barrier layer and into the QW. Thus, when voltage is applied, the bound electron state of the QW quickly becomes populated.

The electrons in the bound electron state then quickly and spontaneously thermalize to the lower polariton state by scattering a single longitudinal optical (LO) phonon. The electrons are able to do this quickly because the electron-polariton transition energy is equal to (resonant with) the energy of a LO phonon. Thus, when voltage is applied, the lower polariton state quickly becomes populated.

The reflectors of the optical microcavity are parallel to the plane of the QW. Thus, photons emitted by radiatively recombining excitons will be trapped inside the optical microcavity. These photons can resonantly recreate bound excitons in the QW. This sharing of energy between photons and excitons effectively combines the two entities into an excitonpolariton.

The photon component of the polariton is emitted from the device by leaking out through one of the microcavity reflectors, which is made to be slightly leaky. The emission is normal to the plane of the QW and is confined to a narrow solid angle.

A second embodiment of the present invention uses a QW with a bound exciton state and lower polariton state separated in energy by an amount equal to one LO phonon. Electrons are resonantly tunneled into the exciton state in the same way as in the first embodiment. Electrons combine with holes to form excitons when they tunnel into the upper exciton state. The exciton then thermalizes to the lower polariton state by scattering a single LO phonon. The photon component of the lower polariton is then emitted through the leaky reflector of the optical cavity.

The present invention is not a laser and as such does not require a population inversion. The present invention can have a zero emission threshold, which is very different from a typical laser which has a finite threshold.

DETAILED DESCRIPTION

Figure 1:
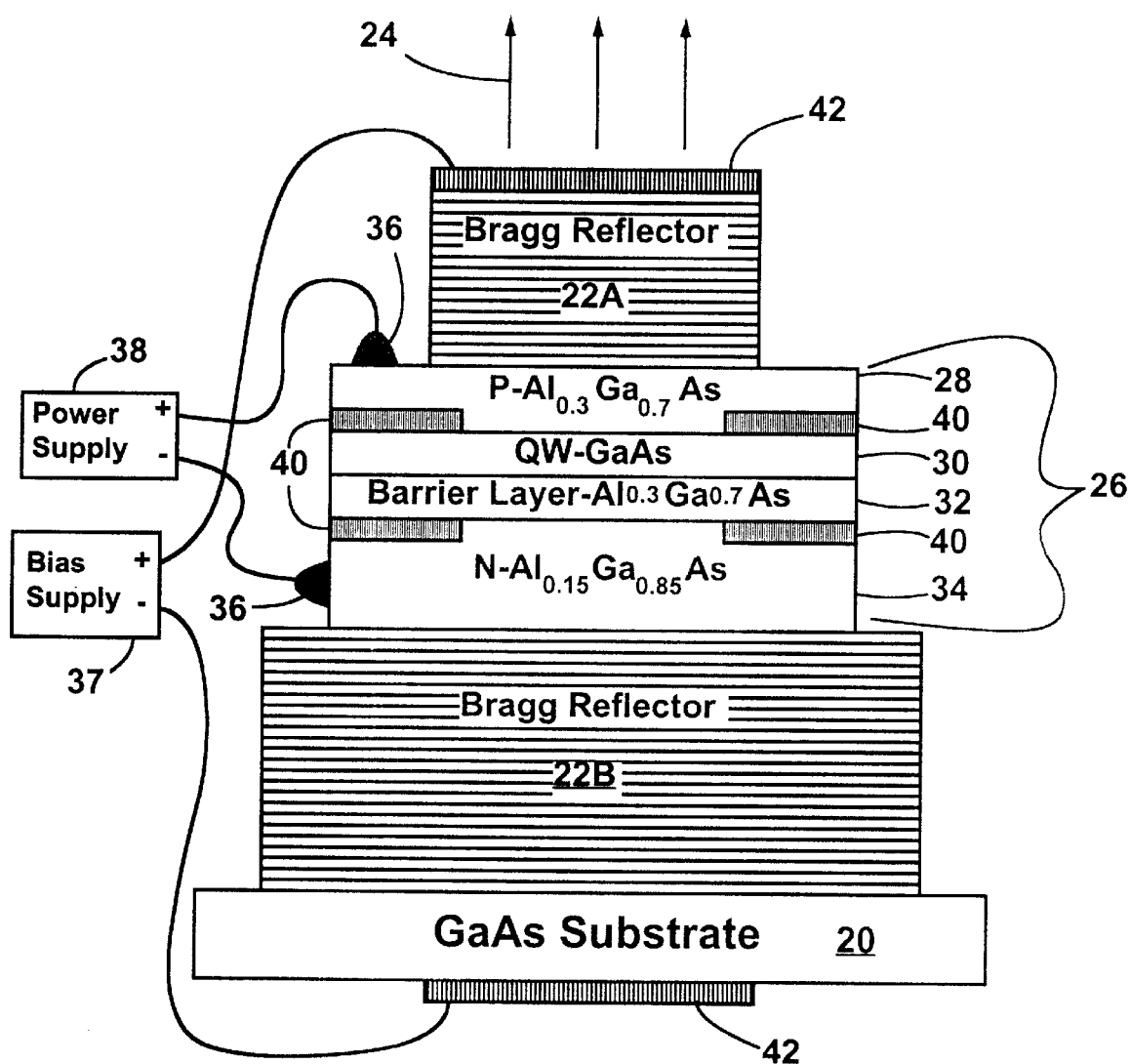
FIG. 1 is a side view of an embodiment of the present invention made of materials in the AlGaAs system.

A preferred embodiment of the present invention is shown in the cross sectional view of FIG. 1. The device is made by Molecular Beam Epitaxy (MBE) on a GaAs substrate 20. All the layers shown are planar and planar parallel. The lateral size of the device can be about 100 $\mu$m by 100 $\mu$m. The top and bottom Bragg reflectors 22A, 22B consist of alternating layers of $Al_{0.15}Ga_{0.85}As$ and $Al_{0.9}Ga_{0.1}As$, shown as white and black bands. Both top 22A and bottom 22B Bragg reflectors are designed to reflect the wavelength of light that the device emits. For a GaAs quantum well device, as in FIG. 1, this wavelength is about 810–820 nm. The bottom Bragg reflector 22B is made to be as nearly a perfect reflector as practical. The top Bragg reflector 22A is made with fewer layers so that it is slightly leaky. Output light 24 is emitted through the leaky top Bragg reflector 22A.

The bottom Bragg reflector 22B can be made with 29 $Al_{0.15}Ga_{0.85}As/Al_{0.9}Ga_{0.1}As$ layer pairs. Each layer should have a thickness of ¼ the wavelength (in the material) of the output light of the device (810 nm for GaAs). The top (leaky) Bragg reflector 22A can be made with 23 $Al_{0.15}Ga_{0.85}As/Al_{0.9}Ga_{0.1}As$ layer pairs of the same construction.

It is noted that any reflectors with acceptable reflectance can be used in place of the Bragg reflectors 22. However, Bragg reflectors are preferred because they allow for monolithic MBE construction and because they have low optical loss. MBE techniques are well known in the art, so it will be obvious to one skilled in the art of MBE how to construct the device shown in FIG. 1. For example, it is well known in the art how to deposit epitaxial layers with desired atomic compositions using MBE. Also, it is well known in the art how to design a Bragg reflector for a specific wavelength and with a desired reflectance. MBE is the preferred method for making the present invention. It is preferred, for example, because it allows for very accurate over the Bragg reflector 22 reflectivity.

The middle portion 26 of the device between the Bragg reflectors consists of four layers comprising a structure very similar to a resonant tunneling diode. The four layer portion consists of a P-doped $Al_{0.3}Ga_{0.7}As$ region (P-region) 28, an undoped GaAs quantum well (QW) 30, a barrier layer of undoped $Al_{0.3}Ga_{0.7}As$ 32, and a N-doped $Al_{0.15}Ga_{0.85}As$ region (N-region) 34. The P-region 28 and N-region 34 have power electrical contacts 36 for connecting to an electrical power supply 38.

The power supply 38 provides the source of operating energy. Electricity from the power supply 38 is converted into light by the device. Current from the power supply 38 flows through the four layers 28, 30, 32, 34 of the middle portion 26 during operation. Insulating oxide regions 40 can be included to funnel the current flow through the four layers 28, 30, 32, 34 in a portion that is directly between the two Bragg reflectors 22A, 22B.

Electrical bias contacts 42A, 42B are provided on top of the top Bragg reflector 22A and on the bottom of the GaAs substrate 20. The top contact 42A should be made with indium tin oxide or another transparent conductive film. These electrical contacts are connected to a bias voltage supply 37 which provides a bias tuning voltage. The separate bias tuning voltage allows for higher speed switching of the device.

Figure 2:
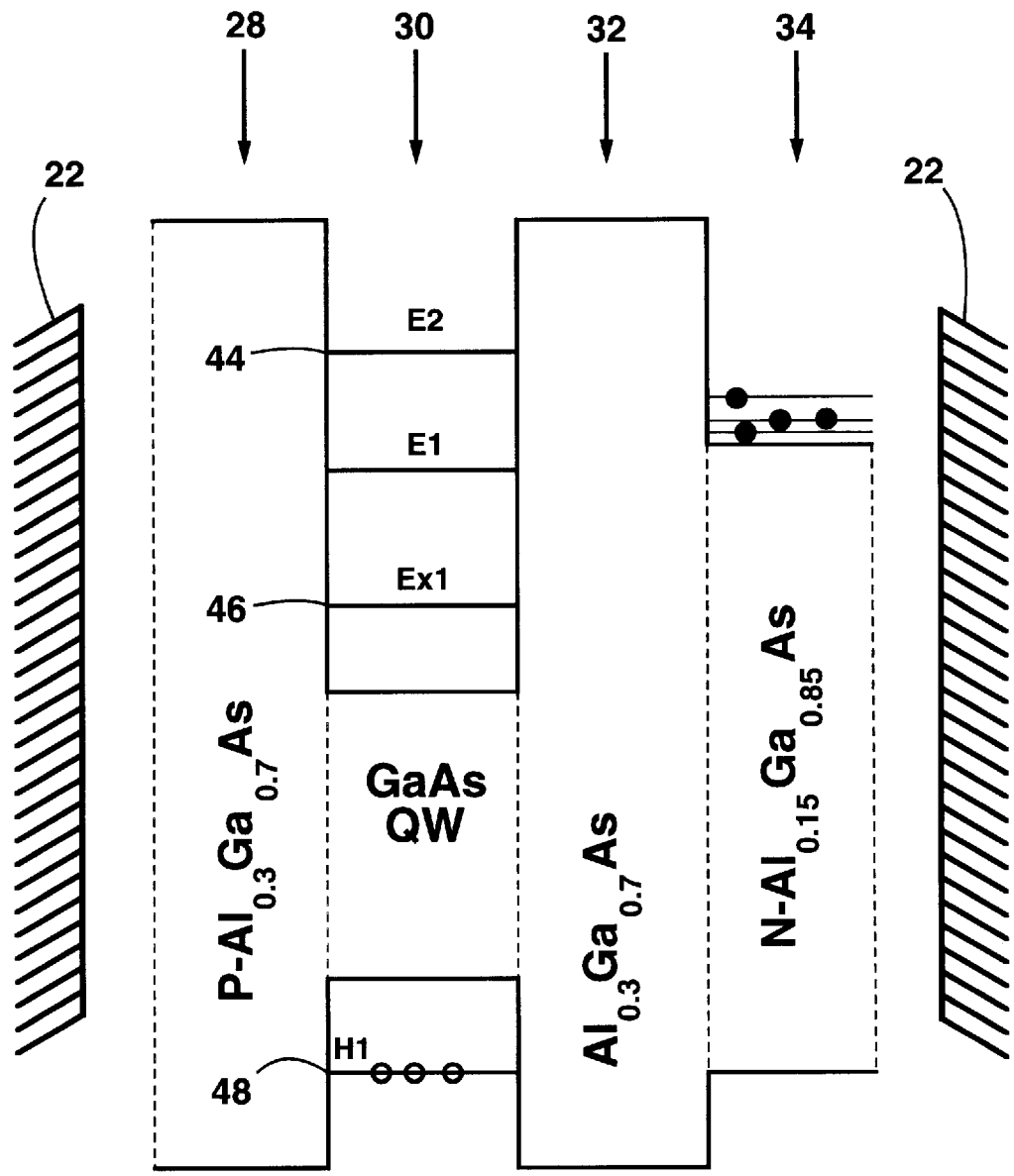
FIG. 2 is a diagram of the band gap structure of the first embodiment.

The band gap structure of the middle portion of the present invention is shown in FIG. 2. The Bragg reflectors 22 are schematically represented. The conductive P-region 28, which has a high bandgap, forms one wall of the quantum well (QW) 30. The QW 30 is a thin layer of undoped GaAs of well-defined, predetermined thickness. The other wall of the QW 30 is formed by a thin barrier layer 32 of undoped $Al_{0.3}Ga_{0.7}As$ of well-defined, predetermined thickness. An electron source is provided by the N-region 34. The conduction band electrons in the N-region 34 are represented by black circles. A hole source is provided by the P-region 28. The thicknesses of the P-region 28 and N-region 34 are designed to provide a predetermined distance between the Bragg reflectors 22. The thicknesses of the QW layer 30 and barrier layer 32 are determined by energy level and tunneling considerations.

The QW 30 shown in FIG. 1 is planar. However, The QW can also be in the shape of a wire or box, provided that it produces the necessary energy levels as described below. It is well known in the art how to construct such quantum wires and quantum boxes. Quantum wires and quantum boxes used in the present invention must have accurate, predetermined physical dimensions to provide the necessary energy levels. Present technologies may not be capable of reliably forming quantum boxes of such accurate size.

The physical thicknesses and barrier energies of the QW 30 and barrier layer 32 are selected to provide bound electron states, bound hole states, and bound exciton states with well-defined, predetermined energies. Excitons are electron-hole pairs bound together by coulomb attraction. They have energy and can radiatively recombine to vanish and produce a single photon of well-defined energy. FIG. 2 shows the QW energy state diagram of a first embodiment of the present invention. There are two bound electron states, E1 and E2 44, one bound exciton state, Ex1 46, and at least one bound hole state, H1 48. The energies of states E2 44, Ex1 46, and H1 48, are carefully selected. The energy of E1 is immaterial.

It is well known in the art how to build QWs with desired electron, hole and exciton energy states. Specifically, it is known how to design and build a QW with a desired 'depth', physical width, and predetermined energy levels.

The H1 hole state 48 in the GaAs QW 30 is lower in energy than the holes in the valence band of the P-region 28. Therefore, holes spontaneously diffuse from the P-region 28 into the QW 30 and the H1 state 48 is always populated. The QW 30 thereby has a steady, nearly infinite supply of H1 holes. The H1 state 48 is a heavy hole state. All the holes referred to in the present description are heavy holes.

It is well known in the art of semiconductor physics that there are two kinds of excitons in the GaAs material system, Heavy Hole (HH) excitons and Light Hole (LH) excitons. All the excitons referred to in the present description are HH excitons.

The face-to-face Bragg reflectors 22 form a high-Q optical microcavity that has resonant electromagnetic modes. The intracavity distance is selected such that the photon energy of a cavity mode is equal to the recombination energy of an Ex1 46 K=0 exciton in the QW 30. The cavity mode is thus coupled with the excitons. This is an essential feature of all the embodiments of the present invention. The intracavity distance is equal to the thickness of the four layer middle portion 26. Since the optical cavity is so short, and the cavity modes separated so widely in energy, there is only one resonant cavity mode to consider. Preferably, the cavity (i.e., the thickness of the 4-layer middle portion) has a length of 1.5 times the wavelength of the cavity mode. Also preferably, the QW 30 is located midway between the Bragg reflectors. More generally, the QW is preferably located at an antinode of the cavity mode used. For the specific AlGaAs device described, which produces exciton recombination photons of about 810–820 nm, the thickness of the 4-layer middle portion (distance between Bragg reflectors 22) should be about 337 nm, since the refractive index of GaAs at 810 nm is about 3.65.

It is noted that the QW energy states 44, 46, 48 may change in energy when power and bias are applied. The present invention must be designed such that the cavity mode=Ex1 46 energy equivalence is satisfied when the device is operating. Thus, in an unpowered state, the cavity mode=Ex1 46 energy equivalence may not be satisfied.

The K=0 condition for the bound Ex1 exciton simply means that the Ex1 exciton is not moving within the plane of the QW, and therefore has no momentum or kinetic energy. It is the lowest energy possible in an energy continuum for the Ex1 exciton. All the excitons mentioned herein are K=0 excitons unless otherwise specified.

When the Ex1 exciton recombination energy is the same as the energy of a cavity mode photon (and the system is energized), the cavity mode will strongly couple with bound Ex1 excitons. Energy will be shared between cavity mode photons and the Ex1 excitons. A resonance condition is established wherein Ex1 excitons spontaneously radiatively recombine to produce photons, and the photons, in turn, recreate Ex1 excitons. The result is hybrid particles called exciton-polaritons, or simply, polaritons. A polariton is a combination of an exciton and a photon. The K=0 exciton condition restricts the associated photons to travel normal to the QW 30 plane and therefore also normal to the Bragg reflectors 22. K>0 excitons will produce photons that travel at an angle to the QW 30 plane, and therefore will not couple to the cavity mode as strongly, an undesirable situation.

Figure 3:
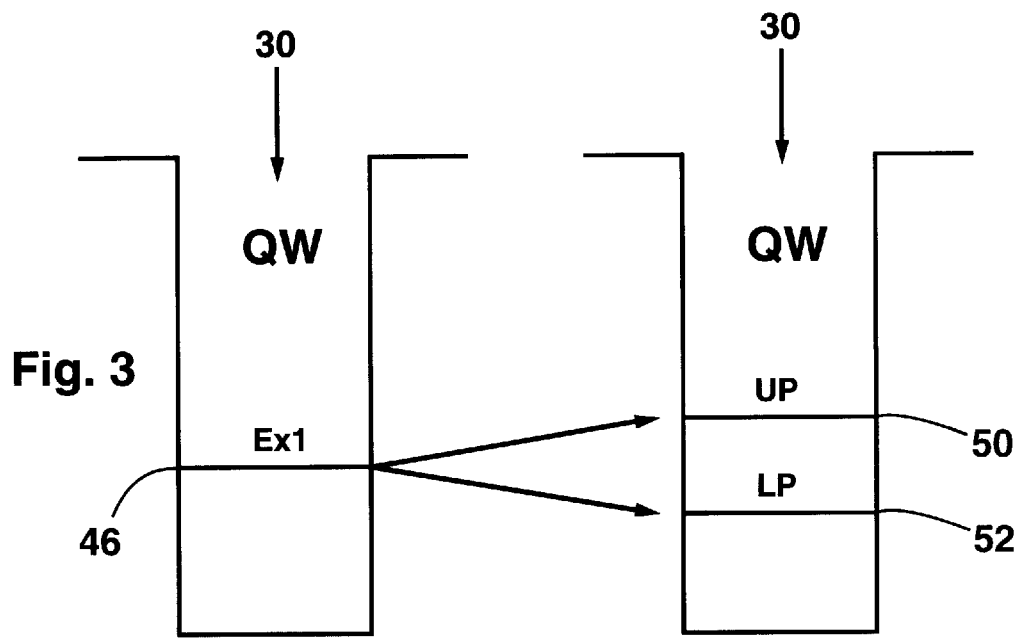
FIG. 3 illustrates the splitting of a bound exciton state into two polariton states due to the tuned optical microcavity formed by the Bragg reflectors.

The [Ex1 exciton energy]=[cavity mode photon energy] condition results in two polariton states due to spin interactions between the Ex1 exciton and the cavity mode photon that constitute each polariton. These new polariton states are not equal in energy and neither polariton state has the same energy as the original Ex1 exciton state 46. The polariton states are termed the upper 50 and lower 52 (UP and LP) polariton states. FIG. 3 illustrates the Ex1 46 exciton energy state splitting into upper 50 and lower 52 polariton states. For the present invention, we are only interested in the LP state 52. The UP state 50 is immaterial. Tuning the present invention to exploit the UP state will result in lower light emission efficiency.

Figure 4:
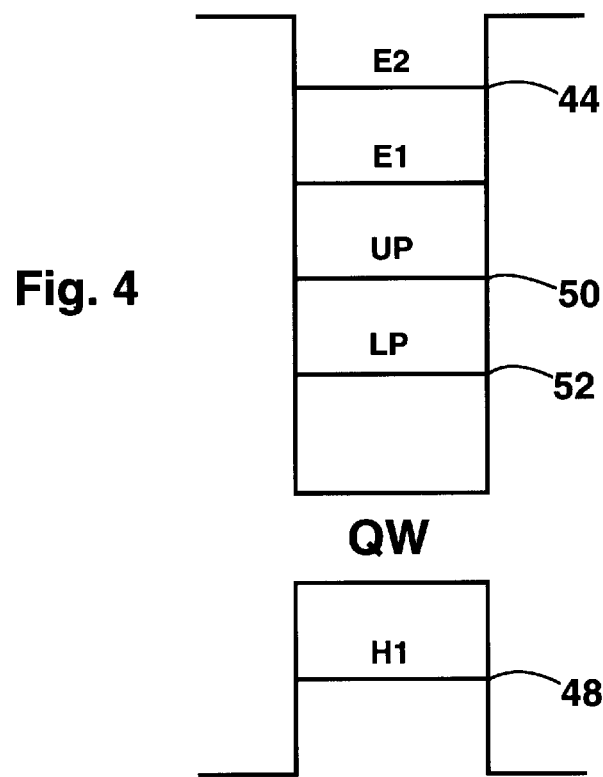
FIG. 4 is a diagram of the energy level structure of the first embodiment showing both polariton states.

FIG. 4 shows a QW energy state diagram of the present invention illustrating the UP 50 and LP 52 polariton states. In the first embodiment of the present invention, the QW 30 is constructed such that the sum of the bound E2 44 electron state and the bound H1 48 hole state minus the energy of the K=0 LP 52 state is equal to the energy of a longitudinal optical (LO) phonon of the QW material. In other words,

[$E2$energy]+[$H1$ energy]−[$K=0LP$energy]=$LO$phonon energy.

This is an essential feature of the first embodiment of the present invention and is termed the LO phonon coupling condition. It is noted that the E2 44 and H1 48 states can be any QW electron and QW hole states which satisfy the LO phonon coupling condition. The E2 state 44 is necessarily higher in energy than the LP state 52. The E1 electron state is immaterial.

It is noted that the E2 44, H1 48, and LP 52 states may change in energy slightly when the device is powered, biased, and operating. The device must be designed such that the LO phonon coupling condition is satisfied when the device is operating. Thus, the LO phonon coupling condition may not be met when the device is in an unpowered, unbiased state.

Due to the LO phonon coupling condition, the E2-to-LP transition is strongly coupled with the LO phonons of the QW material. An electron in the E2 state 44 can thermalize and become a LP 52 polariton by scattering a single LO phonon. During this transition, the original electron combines with a H1 48 hole to form an Ex1 46 exciton and then partially turns into a photon to form the LP state 52 polariton. For a GaAs QW 30, the LO phonon coupling condition effectively requires at least two bound electron states to exist in the QW 30. This is because a single bound electron state cannot be made high enough in energy to satisfy the LO phonon coupling condition. This is the reason why E1 exists, even though it is not used. For GaAs, LO phonons have an energy of approximately 35 meV.

It is noted that the LP state 52 can have different K values just like an exciton can have different K values. In other words, a LP can move within the QW. The polariton K values correspond to values of transverse momentum and energy. The lowest energy LP state 52 has K=0, which implies zero transverse momentum (in the QW plane). All the other polaritons in the LP state 52 (with K>0) form a continuum and have more energy than the K=0 state. The K=0 condition simply means that the constituent Ex1 exciton is stationary. A K=0 polariton requires that the constituent photon travel normal to the QW 30 plane and hence normal to the Bragg reflectors 22. K>0 polaritons will emit photons at an oblique angle to the QW plane. In the present invention, it is strongly desirable to have light emission normal to the QW 30 plane. Therefore, it is preferred that the LP 52 polaritons have K=0. The K=0 LP condition is assured by making it exactly one LO phonon less than the E1+H1 energy sum.

In a device using a GaAs QW 30, an $Al_{0.3}Ga_{0.7}As$ barrier layer 32, an $Al_{0.3}Ga_{0.7}As$ P-region 28, and an $Al_{0.15}Ga_{0.85}As$ N-region 34 as shown in FIG. 1, the above described electron, hole, exciton and polariton energy state requirements can be satisfied with a QW 30 layer thickness of about 20 nm and a barrier layer thickness of about 10 nm. The thickness of the P-region and N-region do not have an effect upon the QW energy states provided they are thick compared to the QW and barrier layers.

Figure 5:
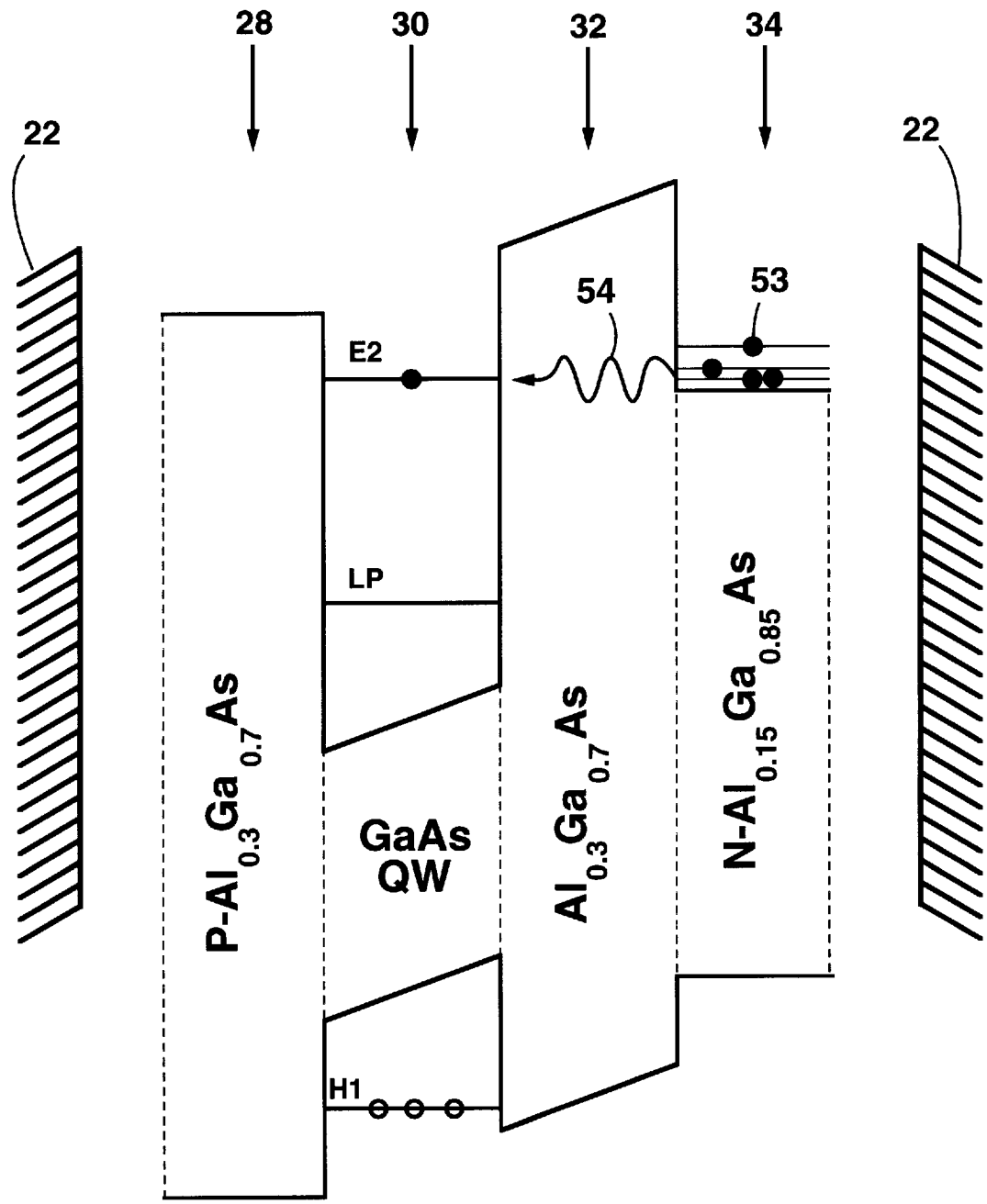
FIG. 5 is a band gap diagram of the first embodiment in operation. This figure illustrates electron tunneling through the barrier layer.

The first step in the operation of the present invention is shown in FIG. 5. Here, an applied voltage between the P-region 28 and N-region 34 and an applied bias voltage between the Bragg reflectors 22 changes the bandgap diagram such that electrons 53 from the N-region 34 can resonantly tunnel 54 through the barrier layer 32 into the E2 electron state 44. Thus, when an appropriate voltage is applied, the E2 electron state 44 becomes populated. It is noted that the P-region 28 receives a positive voltage with respect to the N-region 34 from both the power supply 38 and the bias supply 37. The exact value of the bias voltage is determined thickness of the QW and the relative % of Al and Ga in the $N-Al_{0.15}Ga_{0.85}As$ region 34. In other words, the bias voltage will depend on how high the N-region electrons 53 need to be 'lifted' in order to resonantly tunnel 54 through the barrier layer 32. In normal, steady operation, a steady flow of tunneling 54 electrons maintains the electron population in the E2 state 44.

The time required for electrons to tunnel through the barrier layer 32 can be reduced by reducing the thickness of the barrier layer 32. The typical tunneling time is approximately 10 ns.

Figure 6:
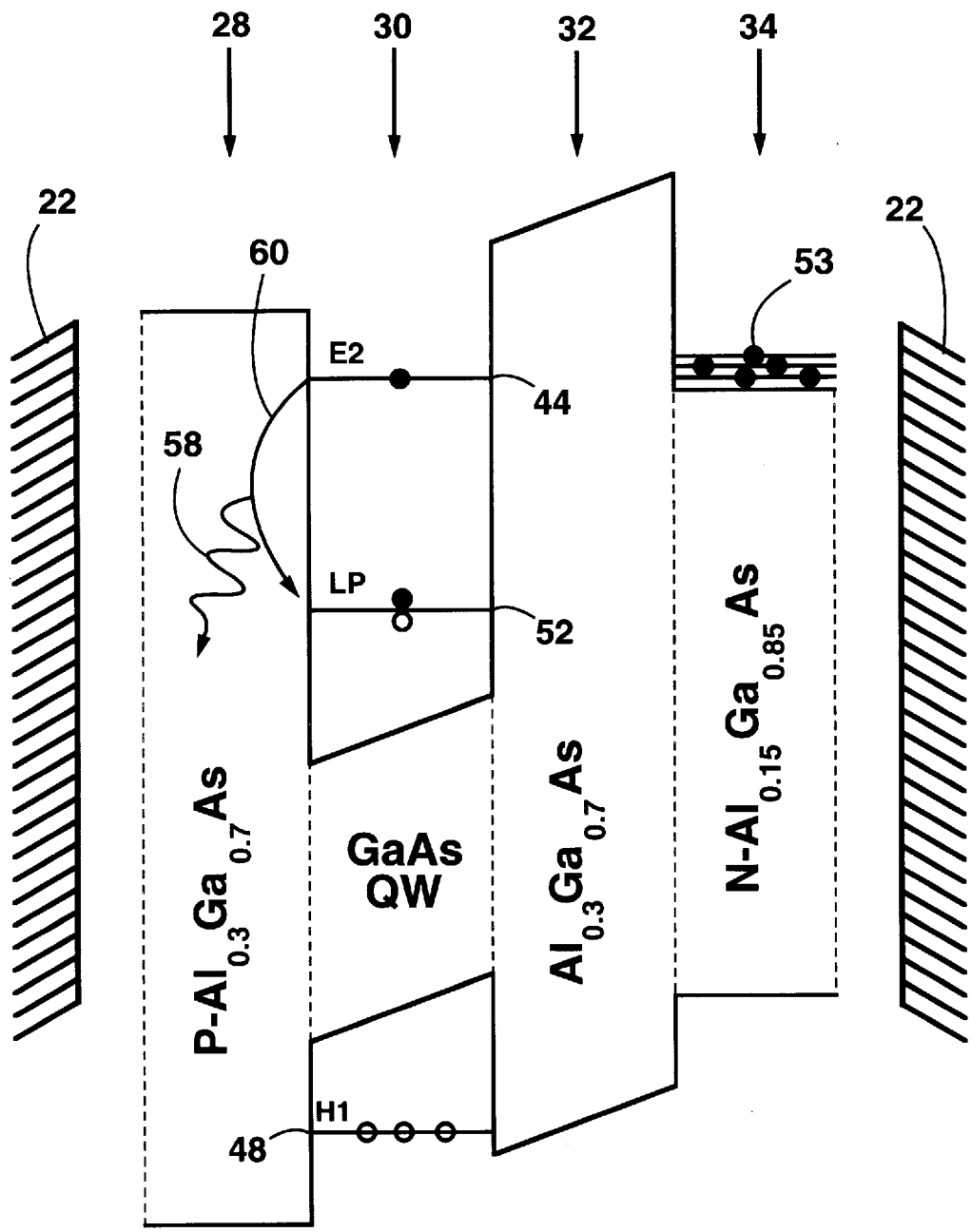
FIG. 6 is a band gap diagram of the first embodiment in operation. This figure illustrates electron state to LP state thermalization.

FIG. 6 illustrates the second step in the operation of the present invention. Since the E2+H1 energy is one LO phonon energy above the LP state 52, the E2 44 electrons rapidly thermalize 60 to the LP state 52 by scattering a single LO phonon 58 and combining with a H1 48 hole. This process is very fast because it only requires the scattering of a single LO phonon 58. Times of 0.2 picoseconds have been observed for resonant LO phonon thermalization of electrons in the GaAs system. Thermalization by scattering multiple acoustic phonons is much slower and therefore is an insignificant consideration. Single LO phonon scattering the only thermalization mechanism that needs to be considered. In this way, the tunneled E2 electrons and H1 holes are rapidly thermalized to bound LP polaritons in the K=0 state. The LP polaritons created are in the K=0 state because the E2 44, H1 48, and LP 52 energy states are tuned for this condition.

The bound Ex1 excitons that comprise the LP polaritons created have very short radiative lifetimes. The radiative lifetime of these Ex1 excitons has been measured to be 10±4 picoseconds in the GaAs system. This is two orders of magnitude faster than the free (not bound in QW) electron-hole radiative recombination lifetime (1ns) in the GaAs system. The radiative lifetime of the excitons is important because it is a part of the limit on the speed of the device.

The photon component of the LP polaritons resonates in the cavity mode and therefore can be considered to be photons reflecting back and forth between the Bragg reflectors 22. The top reflector 22A as shown in FIG. 1 is intentionally made to be slightly leaky. In a particular embodiment of the present invention, the top Bragg reflector 22A is about 96% reflecting. A stream of output photons 24 are therefore emitted from the top reflector 22A. The other, bottom reflector 22B is >99% reflecting.

The present invention can emit fast optical pulses in large part because of the rapid thermalization 60 via LO phonon 58 scattering.

Figure 7:
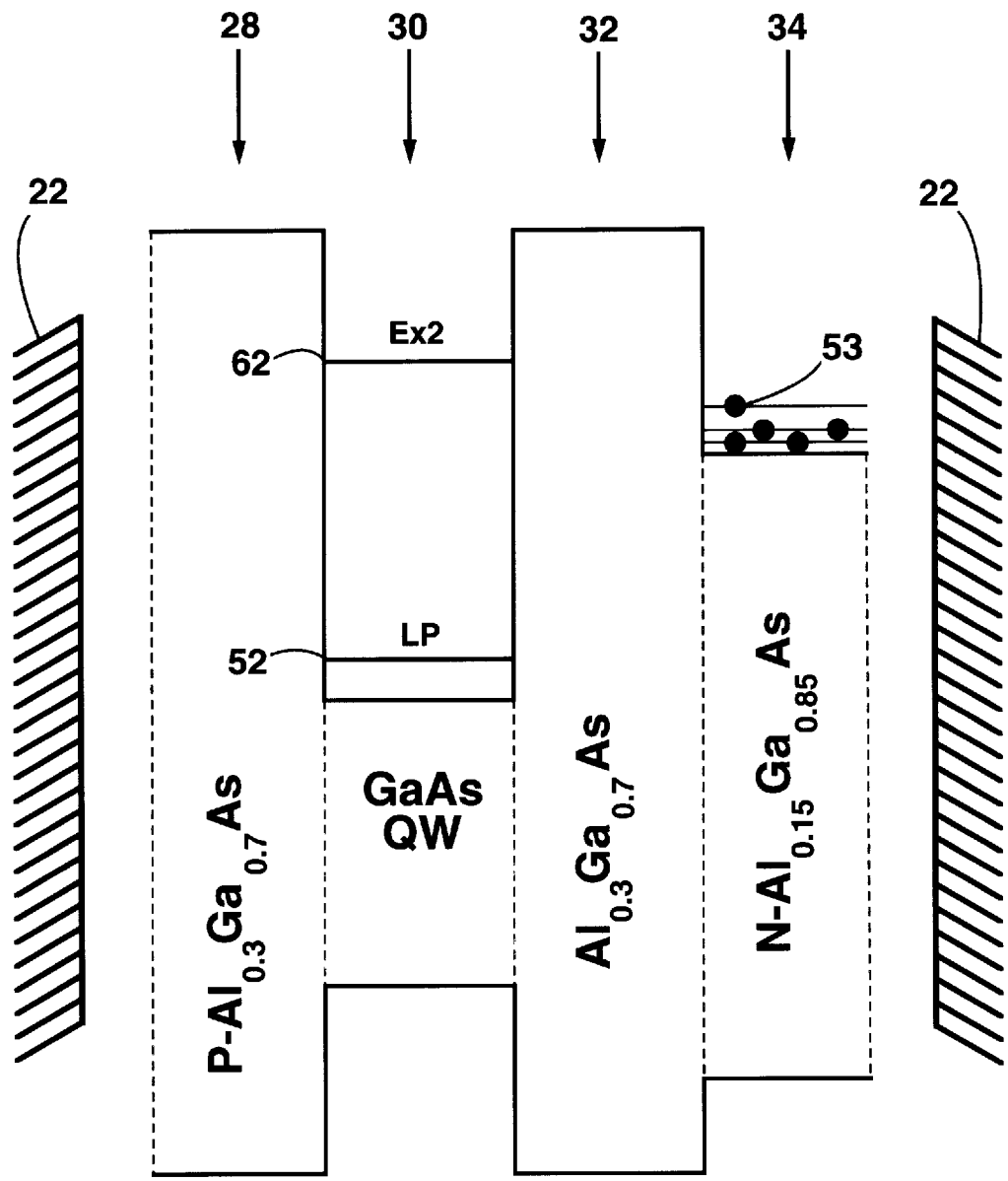
FIG. 7 is a band gap diagram of the second embodiment.

A second embodiment of the present invention uses the same four layer 26/Bragg reflector 22 microcavity structure but with a slightly different energy state structure in the QW 30. The energy states important for the second embodiment are a second exciton state (Ex2) 62, and the LP 52 state. FIG. 7 illustrates the energy state structure of the second embodiment. The Ex2 state 62 is an exciton state higher in energy than the Ex1 46 state. In the second embodiment, N-region electrons 53 are tunneled into the Ex2 state 62 instead of the E2 state 44. In fact, the E2 state 44 is not used in the second embodiment. The difference in QW energy states is the only difference between the first and second embodiments.

In the second embodiment, the Ex1 state 46 is split into the UP 50 and LP 52 polariton states by appropriately tuning the microcavity, just like in the first embodiment. Also, as in the first embodiment, the UP 50 state is unused.

The LO phonon coupling condition for the second embodiment is different, however. For the second embodiment, the LO phonon coupling condition is:

[$Ex2$energy]−[$K=0LP$energy]=$LO$phonon energy.

The design of the second embodiment is the same as the design of the first embodiment with the exception that the Ex2 state 62 is substituted for the E2 state 44 and Hi state 48 in the LO phonon coupling condition.

Of course, all the energy state requirements apply to a device in a powered, operating condition. As noted above, QW energy states can change when power and bias are applied.

Figure 8:
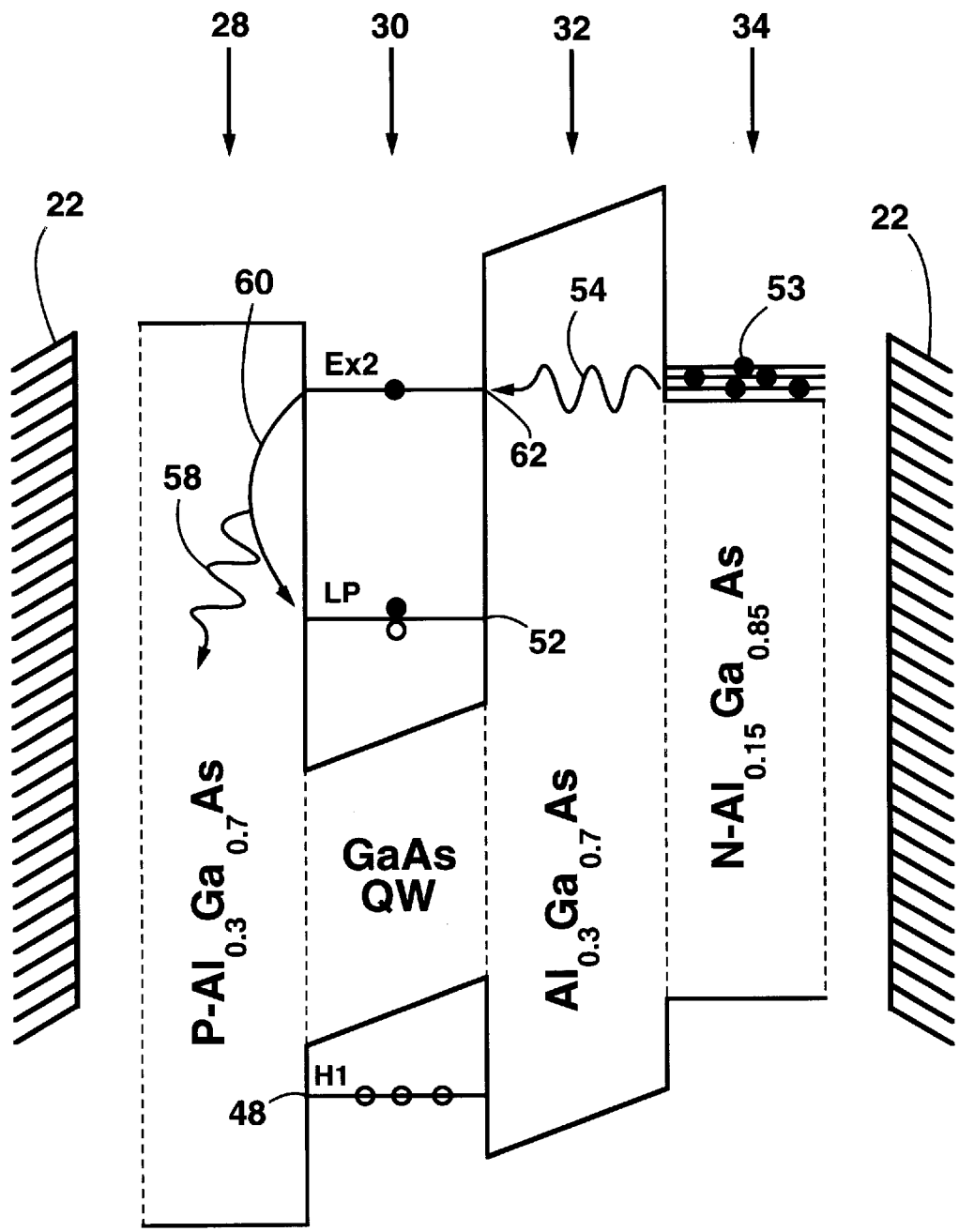
FIG. 8 is a band gap diagram of the second embodiment in operation. This figure illustrates electron tunneling and exciton thermalization steps.

FIG. 8 illustrates the second embodiment in operation. Electrons 53 resonantly tunnel 54 from the N-region 34 into the Ex2 state 62. The fusion of a H1 48 hole and N-region electron 53 into an Ex2 62 exciton is simultaneous with tunneling 54.

The Ex2 excitons then thermalize 60 to LP 52 polaritons by scattering a single LO phonon 58 and partially turning into a photon. This process is very fast, and can take less than 1ps. The photons are cavity mode photons. Output photons 24 are then emitted from the top Bragg reflector 22A by the same mechanism of the first embodiment.

In a device using a GaAs QW 30, an $Al_{0.3}Ga_{0.7}As$ barrier layer 32, an $Al_{0.3}Ga_{0.7}As$ P-region 28, and an $Al_{0.15}Ga_{0.85}As$ N-region 34, the hole, exciton and polariton energy state requirements of the second embodiment can be satisfied with a QW 30 layer thickness of about 20 nm and a barrier layer thickness of about 10 nm. These are the same thicknesses as recommended in the first embodiment. However, proper biasing can provide the necessary differences in energy levels. The thickness of the P-region and N-region do not have an effect upon the QW energy states provided they are thick compared to the QW and barrier layers.

The power supply 38 which can be used to operate the present invention is standard and widely available. Typical voltages used are about 1.6–1.8 volts and the current depends upon the lateral size (surface area) of the device. It will be obvious to one skilled in the art of operating quantum well electronic devices how to select appropriate voltages and currents for the power 38 and bias 37 supplies.

It is noted that the present invention will emit light without the use of the Bragg reflectors 22. Such a device would not be very efficient, but it would be faster than devices which do not exploit the LO phonon resonance condition. The use of a single Bragg reflector would perform better than a device with no reflectors, but worse than a device with two reflectors.

Figure 9A:
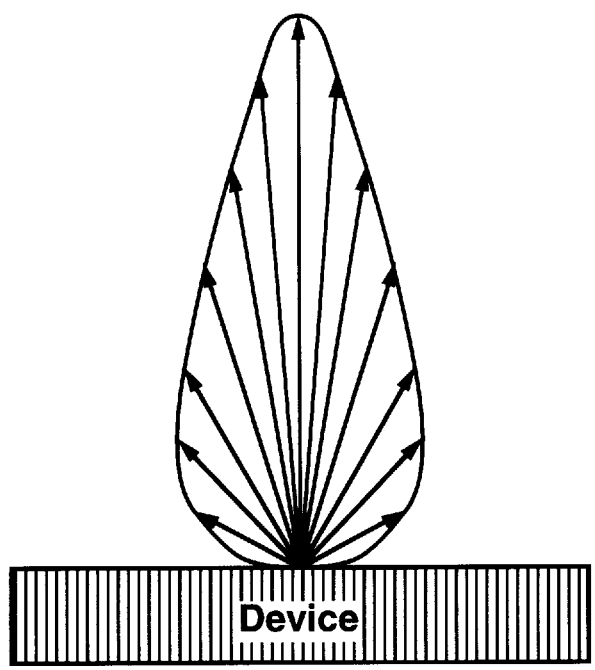
FIGS. 9A–9B illustrate the angular emission patterns for polaritons and excitons, respectively.
Figure 9B:
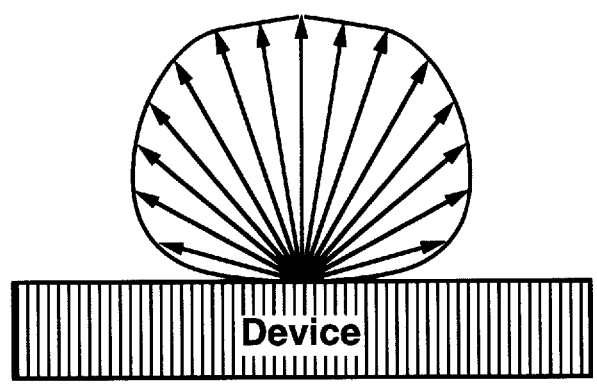

One reason why it is advantageous to use an optical cavity in the present invention is because QW-bound polaritons emit light into a much smaller solid angle than QW-bound excitons do when they radiatively recombine. Thus, locating the QW 30 inside the optical cavity greatly reduces the angular spread of the emitted light 24. FIGS. 9A-9B illustrate the photon emission patterns for QW-bound K=0 polaritons and QW-bound K=0 excitons, respectively.

Another reason for using an optical cavity is because it results in a narrower bandwidth for the optical output 24.

The present invention provides a light source with high quantum efficiency. Quantum efficiency is defined as the ratio of photons emitted 24 in a specified direction to the number of injected electrons or charge carriers. Since the microcavity helps to collimate the output beam 24, the microcavity improves the quantum efficiency.

It is noted that the present invention can be made of any direct bandgap semiconductor material system. The AlGaAs/GaAs material system is just one example of a direct bandgap material system that can be used. For example, by using the GaN/InGaN material system, a device emitting in the blue (380 nm) can be made. Depending on the color desired and the growth technologies available, other direct bandgap semiconductor material systems can be used. The semiconductor material used for the quantum well must be a direct-bandgap material. The other components of the device, such as the Bragg reflectors or N 34 and P 28 regions, may be made from indirect bandgap semiconductor materials The present invention is a semiconductor light emitting device and can be used in any application where light emitting devices are used. Fiber optic communications and optical data storage and recovery are just two examples of possible applications.

It will be clear to one skilled in the art that the above embodiment may be altered in many ways without departing from the scope of the invention. For example, any direct-bandgap semiconductor material system can be used and any power/bias circuitry can be used. Accordingly, the scope of the invention should be determined by the following claims and their legal equivalents

What is claimed is:

1. A light emitting device comprising:
   A) a resonant optical cavity having a resonant mode of predetermined photon energy and with at least one cavity reflector being slightly leaky;
   B) a single quantum well disposed within said resonant optical cavity, said single quantum well forming at least one bound electron state (E), at least one bound exciton state (Ex), at least one bound hole state (H), and a bound lower polariton state (LP), wherein said lower polariton state is formed by matching said predetermined photon energy to the energy of said at least one bound exciton state; and
   C) a resonant tunneling means for resonantly tunneling electrons into said at least one bound electron state; wherein:
   1) said at least one bound electron state (E), said lower polariton state (LP), and said at least one bound hole state (H) satisfy the following condition:

[$E2$energy]+[$H$energy]−[$LP$energy]=$LO$phonon energy, wherein said LO phonon is a longitudinal optical phonon of said quantum well material, and wherein said quantum well material is a direct bandgap semiconductor material,
      such that the photon component of said lower polariton state is emitted through said leaky optical cavity reflector.

2. The light emitting device of claim 1 wherein said lower polariton state is a k=0 lower polariton state.

3. The light emitting device of claim 1 wherein said resonant tunneling means is an n-doped semiconductor material separated from said quantum well by a layer of a quantum barrier material.

4. The light emitting device of claim 3 wherein said quantum barrier material is $Al_xGa_{1-x}As$ with 0<x<1.

5. The light emitting device of claim 1 wherein said device is of monolithic construction.

6. The light emitting device of claim 1 wherein said device is made of materials selected from the group consisting of $Al_xGa_{1-x}As$ with 0<x<1, GaAs, and AlAs.

7. The light emitting device of claim 1 wherein said device is made of materials selected from the group consisting of $In_xGa_{1-x}N$ with 0<x<1, GaN, and InN.

8. The light emitting device of claim 1 wherein said quantum well is in the shape of a wire.

9. The light emitting device of claim 1 wherein said quantum well is in the shape of a box.

10. A light emitting device comprising:
   A) a resonant optical cavity having a resonant mode of predetermined photon energy and with at least one cavity reflector being slightly leaky;
   B) a single quantum well disposed within said resonant optical cavity, said single quantum well forming a low energy bound exciton state (Ex1), a high energy bound exciton state (Ex2), and a bound lower polariton state (LP), wherein said lower polariton state is formed by matching said predetermined photon energy to the energy of said low energy bound exciton state (Ex1); and
   C) a resonant tunneling means for resonantly tunneling electrons into said high energy bound exciton state (Ex2);
   wherein:
      1) said high energy bound exciton state (Ex2), and said lower polariton state (LP) satisfy the following condition:

$$[Ex2\ energy] - [LP\ energy] = LO\ phonon\ energy,$$

wherein said LO phonon is a longitudinal optical phonon of said quantum well material, and wherein said quantum well material is a direct bandgap semiconductor material,
      such that the photon component of said lower polariton state is emitted through said leaky optical cavity reflector.

11. The light emitting device of claim 10 wherein said lower polariton state is a k=0 lower polariton state.

12. The light emitting device of claim 10 wherein said resonant tunneling means is an n-doped semiconductor material separated from said quantum well by a layer of a quantum barrier material.

13. The light emitting device of claim 12 wherein said quantum barrier material is $Al_xGa_{1-x}As$ with $0<x<1$.

14. The light emitting device of claim 10 wherein said device is of monolithic construction.

15. The light emitting device of claim 10 wherein said device is made from materials selected from the group consisting of $Al_xGa_{1-x}As$ with $0<x<1$, GaAs, and AlAs.

16. The light emitting device of claim 10 wherein said device is made of materials selected from the group consisting of $In_xGa_{1-x}N$ with $0<x<1$, GaN, and InN.

17. The light emitting device of claim 10 wherein said quantum well is in the shape of a wire.

18. The light emitting device of claim 10 wherein said quantum well is in the shape of a box.

* * * * *